(12) United States Patent
Zhang et al.

(10) Patent No.: US 8,205,330 B2
(45) Date of Patent: Jun. 26, 2012

(54) METHOD FOR MANUFACTURING A PRINTED CIRCUIT BOARD

(75) Inventors: Qi Zhang, Shenzhen (CN); Yung-Wei Lai, Tayuan (TW); Shing-Tza Liou, Tayuan (TW)

(73) Assignees: FuKui Precision Component (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 1034 days.

(21) Appl. No.: 12/135,873

(22) Filed: Jun. 9, 2008

(65) Prior Publication Data

US 2009/0159317 A1  Jun. 25, 2009

(30) Foreign Application Priority Data

Dec. 19, 2007  (CN) .......................... 2007 1 0203259

(51) Int. Cl.
*H01K 3/10* (2006.01)
(52) U.S. Cl. ................ 29/852; 29/825; 29/830; 29/832; 29/846
(58) Field of Classification Search ............... 29/825, 29/830, 832, 846, 852
See application file for complete search history.

(56) References Cited

U.S. PATENT DOCUMENTS

| 5,481,795 | A | * | 1/1996 | Hatakeyama et al. | 29/852 |
| 6,000,129 | A | * | 12/1999 | Bhatt et al. | 29/852 |
| 6,889,433 | B1 | * | 5/2005 | Enomoto et al. | 29/852 |
| 8,020,292 | B1 | * | 9/2011 | Kumar et al. | 29/852 |
| 2007/0246254 | A1 | * | 10/2007 | Kumar et al. | 174/264 |

FOREIGN PATENT DOCUMENTS

| CN | 1072557 A | 5/1993 |
| CN | 1297567 A | 5/2001 |
| CN | 1382008 A | 11/2002 |
| CN | 1464767 A | 12/2003 |
| TW | 573451 | 1/2004 |
| TW | I275332 | 3/2007 |

* cited by examiner

*Primary Examiner* — Carl Arbes
(74) *Attorney, Agent, or Firm* — Altis Law Group, Inc.

(57) ABSTRACT

An exemplary method for manufacturing printed circuit boards is provided. In the method, a substrate having a first surface and a second surface on an opposite side of the substrate to the first surface is provided. A number of through holes in the substrate between the first surface and the second surface are formed. An electrically conductive paste is applied to the substrate to fill the through holes defined in the substrate to form a plurality of filling members and be printed on at least one of the first surface and the second surface of the substrate to form a number of electrical traces. The filling members located in the through hole in the substrate and the electrical traces printed on the substrate are cured.

9 Claims, 9 Drawing Sheets

METHOD FOR MANUFACTURING A PRINTED CIRCUIT BOARD

BACKGROUND

1. Technical Field

The present invention relates to printed circuit boards, particularly to a printed circuit board and a method for manufacturing the same.

2. Description of Related Art

Printed circuit boards are widely used in electronic products for electrical connection. Nowadays, in order to achieve miniaturization and multifunction of electronic products, printed circuit boards have become smaller and smaller and have high density interconnection.

Typically, printed circuit boards are manufactured using a series of processes including drilling holes in a substrate, filling the holes with a filler such as a resin, laminating a copper layer on the substrate, manufacturing electrical traces using a photolithographic process, and so on. The typical photolithographic process includes the steps of applying a photoresist layer on the copper layer, exposing and developing the photoresist layer, etching the copper layer exposed from the photoresist layer and removing the residual photoresist layer.

However, the typical method of manufacturing printed circuit boards described above are complex and time consuming. Especially, when multilayer printed circuit boards are manufactured using the typical method, the filling process, the laminating process and the photolithographic process are continuously repeated, and thus efficiency of manufacturing multilayer printed circuit boards is low and cost of manufacturing multilayer printed circuit boards is very high.

What is needed, therefore, is a printed circuit board and a method for manufacturing the printed circuit board so as to simplify a process of manufacturing the printed circuit board and save cost of manufacturing the printed circuit board.

SUMMARY

One embodiment provides a method for manufacturing printed circuit boards. In the method, a substrate having a first surface and a second surface on an opposite side of the substrate to the first surface is provided. A number of through holes in the substrate between the first surface and the second surface are formed. An electrically conductive paste is applied to the substrate to fill the through holes in the substrate to form a plurality of filling members and be printed on at least one of the first surface and the second surface of the substrate to form a number of electrical traces. The electrically conductive paste filled in the through holes in the substrate and the electrically conductive paste printed on the at least one of the first surface and the second surface of the substrate are cured.

Another embodiment provides a printed circuit board. The printed circuit board includes a substrate having a first surface and a second surface on an opposite side of the substrate to the first surface. The substrate defines a number of through holes between the first surface and the second surface therein. A number of filling members are located in the through holes in the substrate and a number of electrical traces are formed on at least one of the first surface and the second surface of the substrate. The filling members located in the through holes in the substrate and the electrical traces formed on the at least one of the first surface and the second surface of the substrate are comprised of a cured electrically conductive paste.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below with reference to the drawings.

Figure 1:
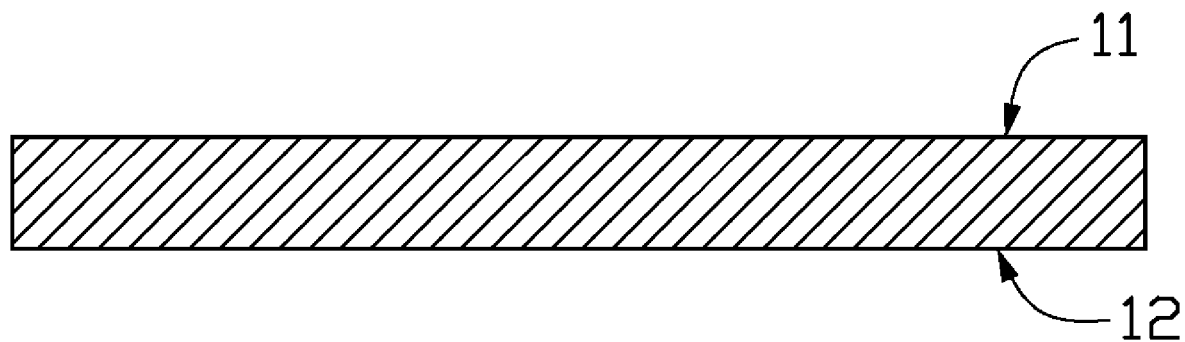
FIG. 1 is a schematic, cross-sectional view of a substrate according to a present embodiment.

A method of manufacturing printed circuit boards includes the following steps:

Step 1: referring to FIG. 1, a substrate 10*a* is provided.

The substrate 10*a* is a prepreg. The prepreg is an insulative reinforcement material, for example, fiberglass fabric impregnated with epoxy resin. The prepreg can be flowable at a certain temperature and a certain pressure, and can be solidified quickly to achieve adhering. The substrate 10*a* includes a first surface 11 and a second surface 12 on an opposite side of the substrate 10*a* to the first surface 11. The first surface 11 and the second surface 12 are configured for disposing electrical traces thereon.

Figure 2:
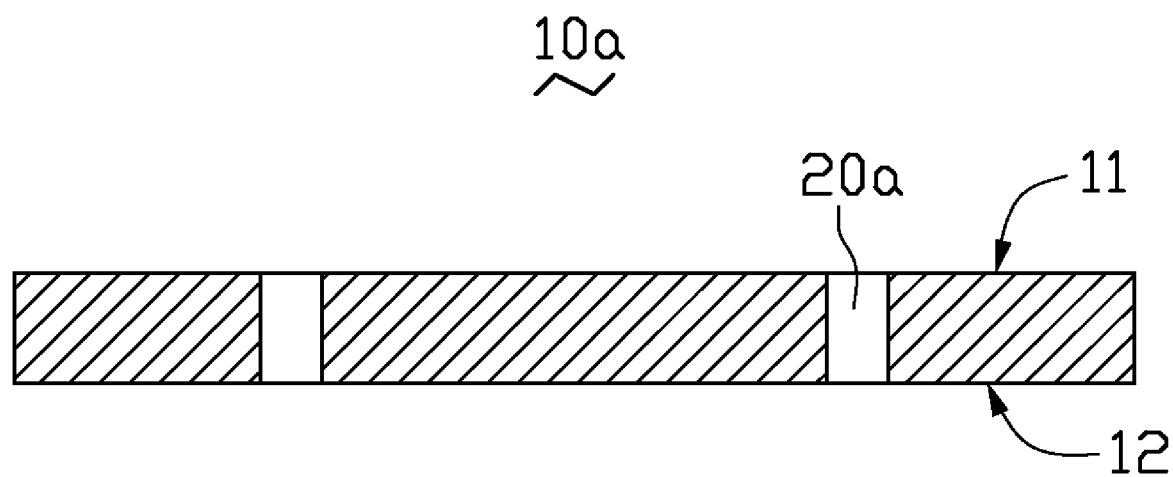
FIG. 2 is a schematic, cross-sectional view of the substrate shown in FIG. 1 having a number of through holes formed therein.

Step 2: referring to FIG. 2, a number of through holes 20*a* are formed in the substrate 10*a*.

The through holes 20*a* can be formed using a laser drilling method or a mechanical drilling method. The through holes 20*a* are defined between the first surface 11 and the second surface 12 and communicating the first surface 11 and the second surface 12.

Figure 3:
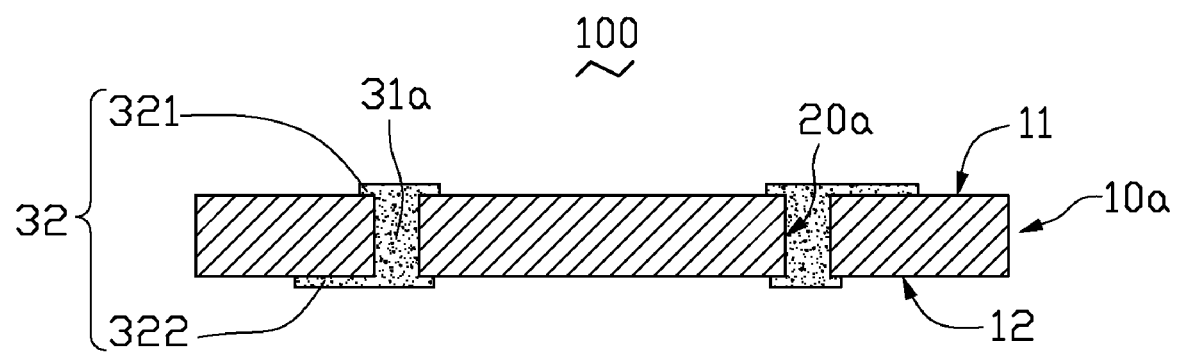
FIG. 3 is a schematic, cross-sectional view of an inner substrate, which is formed by applying an electrically conductive paste onto the substrate shown in FIG. 2.

Step 3: referring to FIG. 3, an electrically conductive paste is applied to the substrate 10a. The electrically conductive paste is filled into the through holes 20a to form a number of filling members 31a and is also printed on at least one of the first surface 11 and the second surface 12 of the substrate 10a to form a number of electrical traces 32.

The electrically conductive paste can be selected from a group consisting of a copper paste, a silver paste and a carbon paste. The electrically conductive paste can be applied onto the substrate 10a using a screen printing method. In the present embodiment, the copper paste is applied onto the substrate 10a. The electrical traces 32 can be formed on the first surface 11, or on the second surface 12, or both on the first surface 11 and the second surface 12. Referring to FIG. 3, the electrically conductive paste is respectively applied to the first surface 11 and the second surface 12. Thus, a number of first electrical traces 321 on the first surface 11, a number of second electrical traces 322 on the second surface 12 and the filling member 31a in the through holes 20a are formed.

In detail, firstly, the electrically conductive paste is applied to the first surface 11 using the screen printing method. In the screen printing process, a first stencil having a first printing pattern (not shown) is placed over the first surface 11 of the substrate 10a. The first printing pattern includes a first pattern corresponding to the through holes 20a and a second pattern corresponding to the first electrical traces 321 to be formed. The electrically conductive paste is applied onto the top surface of the first stencil. The electrically conductive paste is then forced through the first printing pattern of the first stencil by drawing a scratch knife across the top surface of the first stencil. The electrically conductive paste will pass through the first pattern of the first stencil to fill into the through holes 20a to form one portion of each of the filling members 31a. Meanwhile, the electrically conductive paste will also pass through the second pattern of the first stencil to print on the first surface 11 to form the first electrical traces 321. It is understood that the electrically conductive paste can pass through the first pattern of the first stencil to fill into the through holes 20a to form the entire filling members 31a. In the illustrated embodiment, the one portion of each of the filling members 31a connects to the first electrical traces 321.

Secondly, the electrically conductive paste is applied to the second surface 12 using the screen printing method. In the screen printing process, a second stencil having a second printing pattern (not shown) is placed over the second surface 12 of the substrate 10a. The second printing pattern includes a first pattern corresponding to the through holes 20a and a second pattern corresponding to the first electrical traces 322 to be formed. The electrically conductive paste is applied onto the top surface of the second stencil. The electrically conductive paste is then forced through the second printing pattern of the second stencil by drawing the scratch knife across the top surface of the second stencil. The electrically conductive paste will pass through the first pattern of the second stencil to fill into the through holes 20a to form another portion of each of the filling members 31a. The another portion connects to the aforementioned one portion to form the entire filling member 31a. Meanwhile, the electrically conductive paste will also pass through the second printing pattern of the second stencil to print on the second surface 12 to form the second electrical traces 322. In the illustrated embodiment, the second electrical traces 322 connect to another portion of each of the filling member 31a. Thus, each of the filling members 31a respectively connects to the first electrical traces 321 and the second electrical traces 322. The filling member 31a, the first electrical traces 321 and the second electrical traces 322 are comprised of the electrically conductive paste, each of the filling members 31a is configured for achieving electrical connection between the first electrical traces 321 and the second electrical traces 322.

It is noted that the second stencil and the first stencil can have identical second patterns when the first electrical traces 321 is identical to the second electrical traces 322. It is also note that the second stencil can only have the second pattern corresponding to the first electrical traces 322 when the electrically conductive paste is applied to the first surface 11 to fill into the through holes 20a to form the entire filling members 31a.

Additionally, during applying the electrically conductive paste to the second surface 12, a nail bed can be used to support the substrate 10a. In detail, a number of nails contact the region of the first surface 11 that does not contain the first electrical traces 321 thereon, and the region corresponding to the through holes 20a. Thus, the first electrical traces 321 can be prevented from damage during applying the electrically conductive paste onto the second surface 12 and the electrically conductive paste can be prevented from flowing out of the through holes 20a.

Step 4: the electrically conductive paste in the through holes 20a and the electrically conductive paste printed on the at least one of the first surface 11 and the second surface 12 of the substrate 10a are cured.

Conditions of curing the filling member 31a and the electrical traces 32 are determined by properties of the electrically conductive paste. In the present embodiment, the filling member 31a and the electrical traces 32 (i.e., the electrically conductive paste in the through holes 20a and the electrically conductive paste printed on the at least one of the first surface 11 and the second surface 12 of the substrate 10a) can be cured under an ultraviolet radiation. The substrate 10a having the filling members 31a, the first electrical traces 321 and the second electrical traces 322 can be subjected to an ultraviolet radiation for about 30~60 seconds. As a result, the filling members 31a, the first electrical traces 321 and the second electrical traces 322 are cured and integrated into the substrate 10a to form a single-layer double-sides printed circuit board 100. It is noted there can be two curing processes; one being performed after forming the first electrical traces 321 and one portion of each of the filling members 31a, and another being performed after forming the second electrical traces 321 and another portion of each of the filling members 31a.

Figure 4:
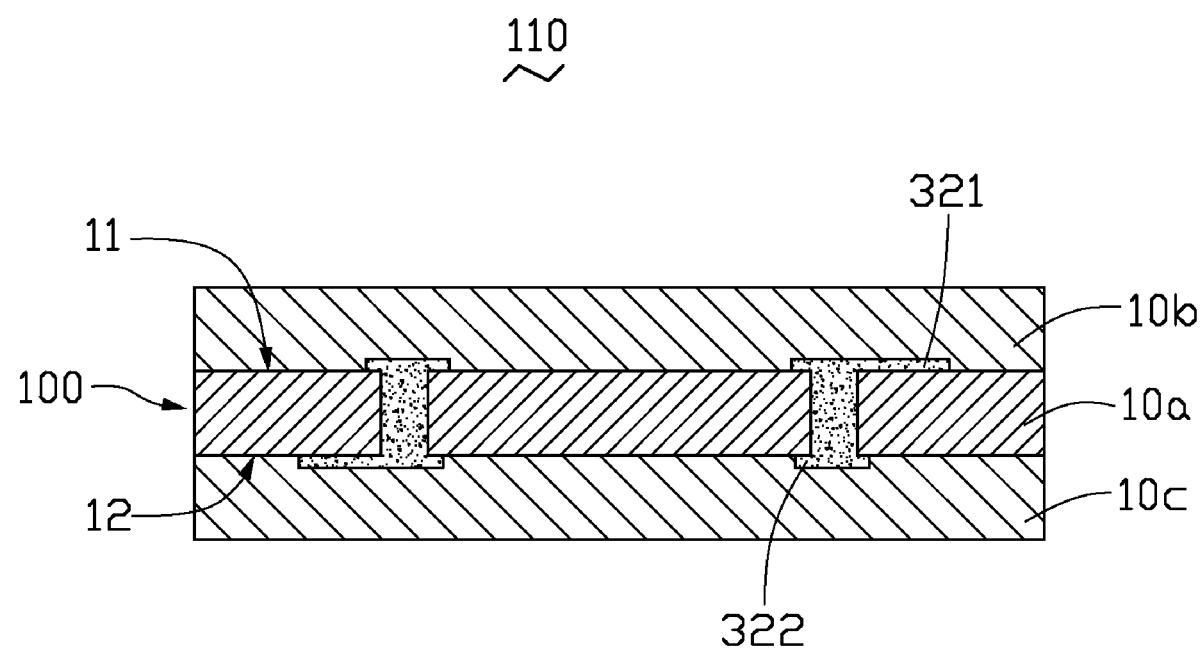
FIG. 4 is a schematic, cross-sectional view of a multilayer substrate, which is formed by laminating a laminating substrate on the inner substrate shown in FIG. 3.
Figure 5:
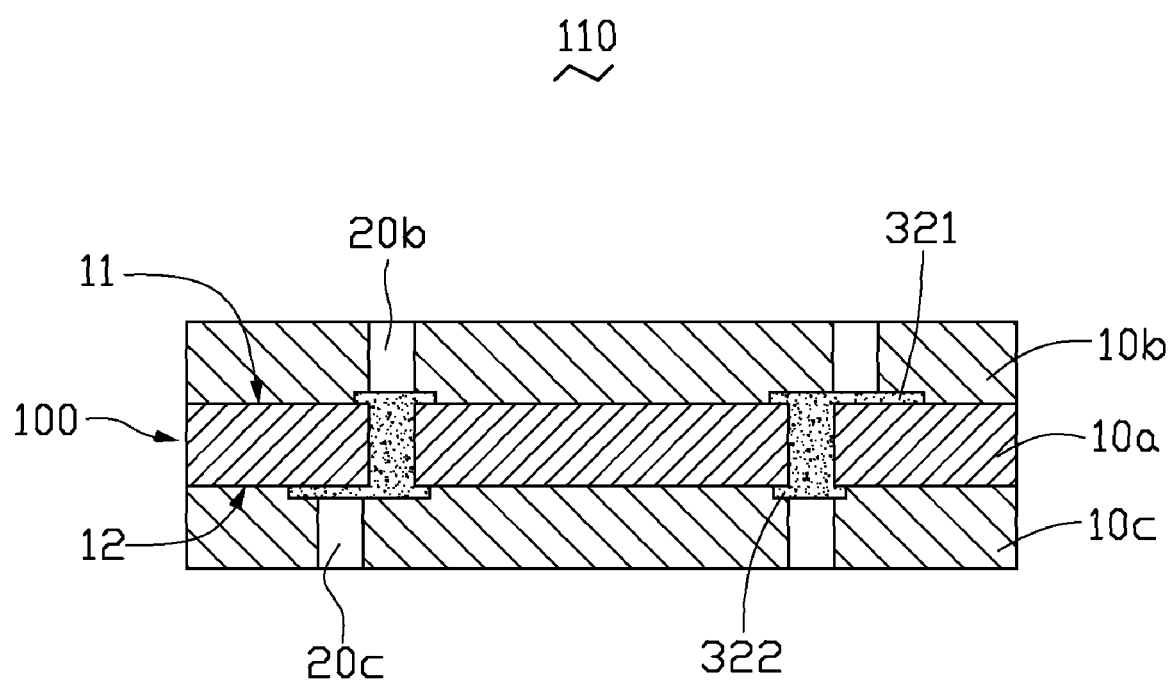
FIG. 5 is a schematic, cross-sectional view of the multilayer substrate shown in FIG. 4, whose laminating substrates have a number of through holes formed therein.
Figure 6:
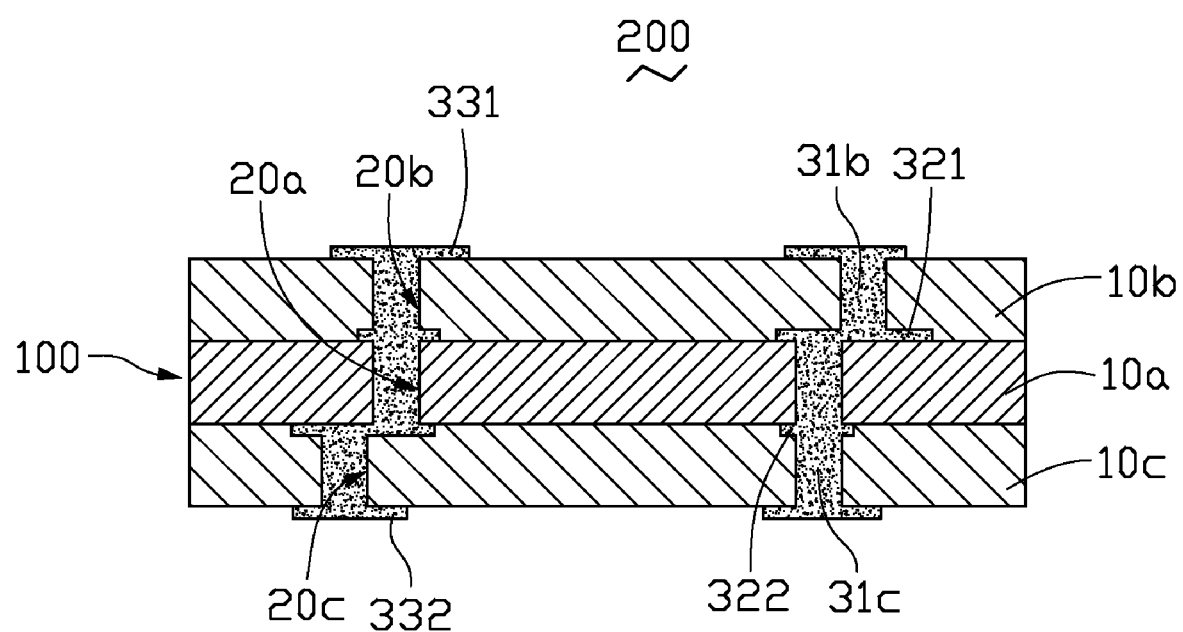
FIG. 6 is a schematic, cross-sectional view of a printed circuit board, which is formed by applying an electrically conductive paste to fill into the through holes and printing an electrically conductive paste on the laminating substrate shown in FIG. 5 to form electrical traces.

The substrate 10a having the cured filling members 31a, the cured first electrical traces 321 and the cured second electrical traces 322 can be regarded as a single-layer double-sides printed circuit board. Also, the substrate 10a having the cured filling members 31a, the cured first electrical traces 321 and the cured second electrical traces 322 can be used as an inner substrate 100 for manufacturing multilayer printed circuit boards. Referring to FIG. 4 to FIG. 6, a number of continuing steps are described to manufacture a multilayer printed circuit board 200 using the inner substrate 100.

Step 5: at least one laminating substrate is laminated on the inner substrate 100.

The laminating substrate can be laminated on one surface of the inner substrate 100 or two opposite surfaces of the inner substrate 100 to form a multilayer substrate 110. Referring to FIG. 4, in the illustrated embodiment, the two laminating substrates 10b, 10c are respectively laminated on the first surface 11 having the first electrical traces 321 thereon and the second surface 12 having the second electrical traces 322 thereon. The laminating substrates 10b, 10c are prepregs. The prepreg is an insulative reinforcement material, for example, fibreglass fabric impregnated with epoxy resin. The prepreg can be flowable at a certain temperature and a certain pressure and can be solidified quickly to achieve adhering the laminating substrate 10b to the first surface 11 and the first electrical traces 321 and adhering the laminating substrate 10c to the second surface 12 and the second electrical traces 322.

Step 6: referring to FIG. 5, a number of through holes 20b, 20c are respectively formed in the laminating substrates 10b, 10c.

The through holes 20b, 20c can be formed using a laser drilling method or a mechanical drilling method. The through holes 20b, 20c are defined between two surfaces on two opposite sides of the corresponding laminating substrate 10b, 10c. The first electrical traces 321 and the second electrical traces 322 are respectively exposed from the through holes 20b, 20c. It is noted that the through holes 20b, 20c can be formed in the laminating substrates 10b, 10c before laminating the laminating substrates 10b, 10c on the inner substrate 100.

Step 7: referring to FIG. 6, the electrically conductive paste is applied onto the laminating substrate 10b, 10c so as to fill the electrically conductive paste into the through holes 20b, 20c to form a number of filling members 31b, 31c and print the electrically conductive paste on a surface of the laminating substrate 10b, 10c to form a number of electrical traces 331, 332.

A method of applying the electrically conductive paste onto the laminating substrate 10b, 10c is similar to the method of applying the electrically conductive paste onto the substrate 10a as described above. The electrically conductive paste is applied to the laminating substrate 10b, 10c using the similar screen printing process so as to fill the electrically conductive paste into the through holes 20b, 20c to form a number of filling members 31b, 31c and print the electrically conductive paste on the surface of the laminating substrate 10b, 10c to form a number of electrical traces 331, 332. The filling member 31b is configured for achieving electrical connection between the electrical traces 331 and the first electrical traces 321. The filling member 31c is configured for achieving electrical connection between the electrical traces 332 and the second electrical traces 321.

Step 8: the electrical conductive paste in the through holes 20b, 20c are cured.

Conditions of curing the filling member 31b, 31c and the electrical traces 331, 332 are determined by properties of the electrically conductive paste. In the present embodiment, the electrically conductive paste in the through holes 20b, 20c can be cured under an ultraviolet radiation. The filling member 31b, 31c and the electrical traces 331, 332 (i.e., the electrically conductive paste in the through holes 20b, 20c) can be subjected to an ultraviolet radiation for about 30~60 seconds. As a result, the filling member 31b, 31c and the electrical traces 331, 332 are cured and integrated into the inner substrate 100 and the laminating substrate 10b, 10c to form a multilayer printed circuit board 200.

The multilayer printed circuit board 200 includes the inner substrate 100 and the laminating substrates 10b, 10c laminated on the inner substrate 100. The inner substrate 100 includes the substrate 10a having a number of through holes 20a defined therein. The filling member 31a located in the through holes 20a, the first electrical traces 321 and the second electrical traces 322 formed on the substrate 10a are comprised of the cured electrically conductive paste. The laminating substrates 10b, 10c defines a number of through holes 20b, 20c therein. The filling member 31b, 31c located in the through holes 20b, 20c, the electrical traces 331, 332 formed on the laminating substrate 10b, 10c are also comprised of the cured electrically conductive paste.

It is noted that the multilayer printed circuit board 200 as shown in FIG. 6 can be used as an inner substrate to manufacture more multilayer printed circuit boards when steps 5-8 are repeated.

After the electrical traces is formed, the following wet processes including printing legend, electroplating gold, printing solder resist, and so on, can be performed selectively.

Additionally, during manufacturing multilayer printed circuit boards, electrical traces of one layer can be form of the copper foil selectively. Referring to FIGS. 4~5, and FIGS. 7~9, a number of continuing steps are described to manufacture a multilayer printed circuit board 300 using the inner substrate 100.

Firstly, at least one laminating substrate is laminated on the inner substrate 100.

The laminating substrate can be laminated on one surface of the inner substrate 100 or two opposite surfaces of the inner substrate 100. Referring to FIG. 4, in the illustrated embodiment, the two laminating substrates 10b, 10c are respectively laminated on the first surface 11 having the first electrical traces 321 thereon and the second surface 12 having the second electrical traces 322 thereon to form the multilayer substrate 110.

Secondly, referring to FIG. 5, a number of through holes 20b, 20c are formed in the laminating substrates 10b, 10c, respectively.

The through holes 20b, 20c can be formed using a laser drilling method or a mechanical drilling method. The through holes 20b, 20c are defined between two surfaces on two opposite sides of the corresponding laminating substrate 10b, 10c. The first electrical traces 321 and the second electrical traces 322 are exposed from the through holes 20b, 20c, respectively. It is noted that the through holes 20b, 20c can be formed in the laminating substrates 10b, 10c before laminating the laminating substrates 10b, 10c on the inner substrate 100.

Figure 7:
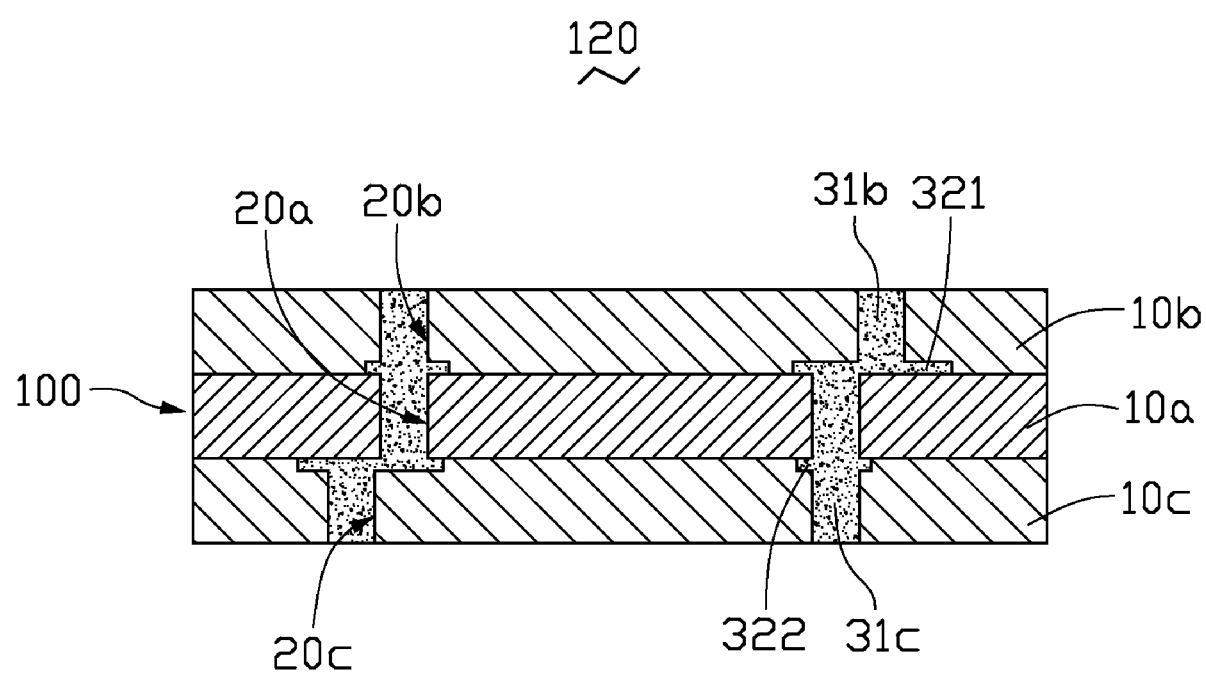
FIG. 7 is a schematic, cross-sectional view of a filling multilayer substrate, which is formed by applying an electrically conductive paste to fill into the through holes of the multilayer substrate shown in FIG. 5.

Thirdly, referring to FIG. 7, the electrically conductive paste is applied onto the laminating substrate 10b, 10c so as to fill the electrically conductive paste into the through holes 20b, 20c to form a number of filling members 31b, 31c.

A method of applying the electrically conductive paste onto the laminating substrate 10b, 10c is similar to the method of applying the electrically conductive paste onto the substrate 10a as described above. However, the electrically conductive paste is applied onto the laminating substrate 10b, 10c using the similar screen printing process so as to only fill the electrically conductive paste into the through holes 20b, 20c to form a number of filling members 31b, 31c, thereby forming a filling multilayer substrate 120.

Figure 8:
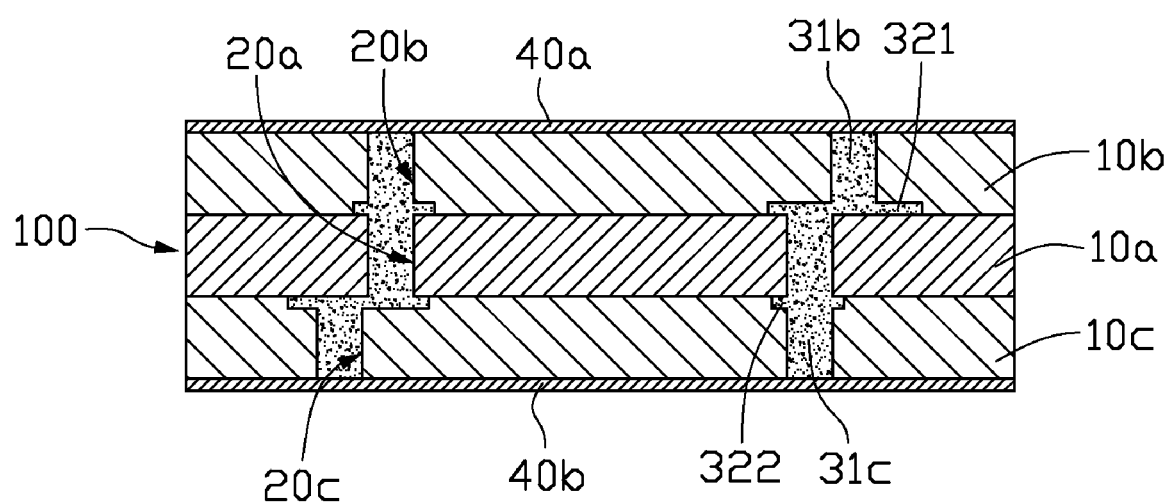
FIG. 8 is a schematic, cross-sectional view of a copper clad multilayer substrate, which is formed by laminating a copper layer on the filling multilayer substrate shown in FIG. 7.

Fourthly, referring to FIG. 8, the copper foils 40a, 40b are respectively laminated on the laminating substrate 10b, 10c.

The copper foils 40a, 40b is a rolling anneal copper foil that is flexible and ductile. In the illustrated embodiment, the copper foil 40a, 40b are laminated on the surface of the laminating substrate 10b, 10c, respectively.

Figure 9:
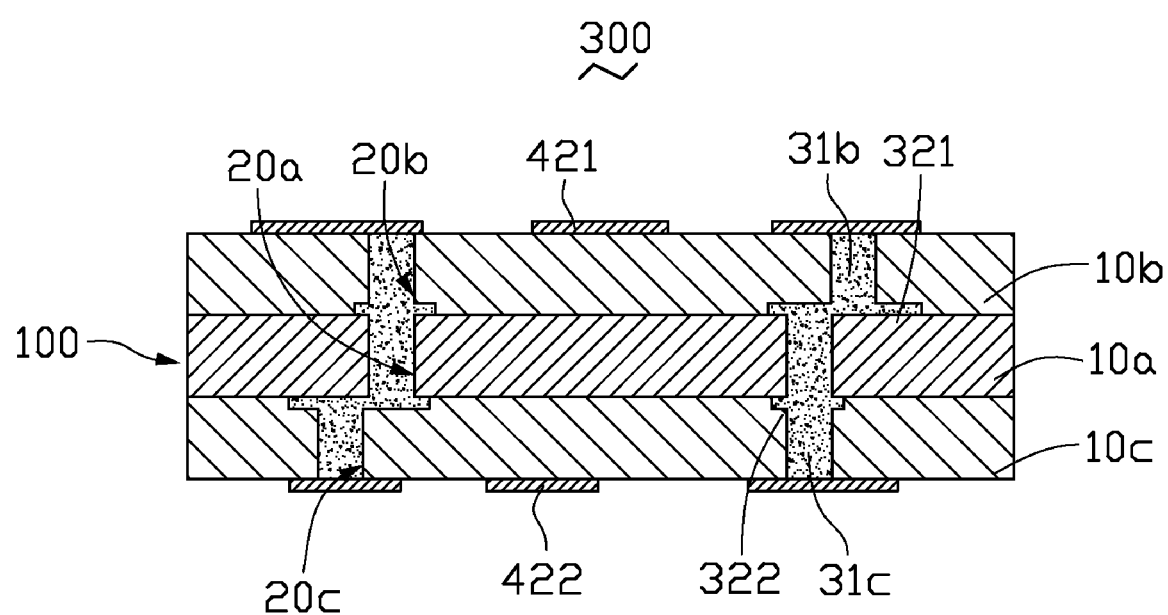
FIG. 9 is a schematic, cross-sectional view of a printed circuit board, which is formed by processing the copper layer of the copper clad multilayer substrate shown in FIG. 8 to form electrical traces.

Fifthly, referring to FIG. 9, the electrical traces 421, 422 are formed with the copper foil 40a, 40b.

The electrical traces 421, 422 can be formed with the copper foil 40a, 40b using a typical photolithographic process or a laser processing process, thereby forming the multilayer printed circuit board 300.

The multilayer printed circuit board 300 includes the inner substrate 100 and the laminating substrates 10b, 10c laminated on the inner substrate 100. The inner substrate 100 includes the substrate 10a having a number of through holes 20a defined therein. The filling member 31a located in the through holes 20a, the first electrical traces 321 and the second electrical traces 322 formed on the substrate 10a are comprised of the cured electrically conductive paste. The laminating substrates 10b, 10c defines a number of through holes 20b, 20c therein. The filling members 31b, 31c located in the through holes 20b, 20c are comprised of the cured electrically conductive paste. The electrical traces 421, 422 on the laminating substrates 10b, 10c are formed with the copper foil 40a, 40b. It is noted that the multilayer printed circuit board 300 can further include other laminating substrates defining a number of through holes therein. The filling member in the through holes, the electrical traces other on the laminating substrates all are comprised of the cured electrically conductive paste.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for manufacturing a printed circuit board, comprising:
   providing a substrate having a first surface and a second surface on an opposite side of the substrate to the first surface;
   forming a plurality of through holes in the substrate between the first surface and the second surface;
   applying an electrically conductive paste to the substrate to cause a first portion of the electrically conductive paste to fill the through holes in the substrate to form a plurality of filling members and simultaneously cause a second portion of the electrically conductive paste to be printed on at least one of the first surface and the second surface of the substrate to form a plurality of electrical traces, thereby the filling members and the electrical traces being formed simultaneously; and
   curing the electrically conductive paste in the through holes and the electrically conductive paste printed on the at least one of the first surface and the second surface of the substrate.

2. The method as claimed in claim 1, wherein the electrically conductive paste is selected from a group consisting of a copper paste, a silver paste and a carbon paste.

3. The method as claimed in claim 1, wherein the substrate is a prepreg.

4. The method as claimed in claim 1, wherein the electrically conductive paste is cured under an ultraviolet radiation.

5. The method as claimed in claim 1, further comprising:
   laminating a laminating substrate on the substrate;
   forming a plurality of through holes in the laminating substrate between opposite surfaces thereof;
   applying an electrically conductive paste to the laminating substrate to fill the through holes in the laminating substrate to form a plurality of filling members; and
   curing the electrically conductive paste in the through holes in the laminating substrate.

6. The method as claimed in claim 5, further comprising:
   laminating a copper foil on a surface of the laminating substrate; and
   forming the copper foil into a plurality of electrical traces.

7. The method as claimed in claim 1, further comprising:
   laminating a laminating substrate on the substrate;
   forming a plurality of through holes in the laminating substrate between opposite surfaces thereof;
   applying an electrically conductive paste to the laminating substrate to cause a first portion of the electrically conductive paste to fill the through holes in the laminating substrate to form a plurality of filling members and simultaneously cause a second portion of the electrically conductive paste to be printed on a surface of the laminating substrate to form a plurality of electrical traces, thereby the filling members and the electrical traces being formed simultaneously; and
   curing the electrically conductive paste in the through holes in the laminating substrate and the electrically conductive paste on the surface of the laminating substrate.

8. A method for manufacturing a printed circuit board, comprising:
   providing a substrate having a first surface and a second surface on an opposite side of the substrate to the first surface;
   defining a plurality of through holes in the substrate between the first surface and the second surface;
   applying an electrically conductive paste to the substrate using a screen printing process such that a first portion of the electrically conductive paste is printed on at least one of the first surface and the second surface of the substrate for forming into a plurality of electrical traces, and a second portion of the electrically conductive paste is simultaneously received in the through holes in the substrate for forming into filling members in the through holes, thereby the filling members and the electrical traces being formed simultaneously; and
   solidifying the electrically conductive paste such that the first portion thereof is formed into the electrical traces on at least one of the first surface and the second surface of the substrate, and the second portion thereof is formed into the filling members in the through holes for establishing electrical connection between the first and second surfaces of the substrate.

9. The method as claimed in claim 8, further comprising:
   laminating a laminating substrate on the substrate;
   forming a plurality of through holes in the laminating substrate between opposite surfaces thereof;
   applying an electrically conductive paste to the laminating substrate to cause a first portion of the electrically conductive paste to fill the through holes in the laminating substrate to form a plurality of filling members and simultaneously cause a second portion of the electrically conductive paste to be printed on a surface of the laminating substrate to form a plurality of electrical traces, thereby the filling members and the electrical traces being formed simultaneously; and
   curing the electrically conductive paste in the through holes in the laminating substrate and the electrically conductive paste on the surface of the laminating substrate.

* * * * *